(12) United States Patent
Park et al.

(10) Patent No.: US 12,550,338 B2
(45) Date of Patent: Feb. 10, 2026

(54) THREE DIMENSIONAL CROSS-POINT NON-VOLATILE MEMORY

(71) Applicant: International Business Machines Corporation, Armonk, NY (US)

(72) Inventors: Chanro Park, Clifton Park, NY (US); Julien Frougier, Albany, NY (US); Ruilong Xie, Niskayuna, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 506 days.

(21) Appl. No.: 17/879,462

(22) Filed: Aug. 2, 2022

(65) Prior Publication Data

US 2024/0049478 A1    Feb. 8, 2024

(51) Int. Cl.
*H10B 63/00*  (2023.01)
*H10N 70/00*  (2023.01)
*H10N 70/20*  (2023.01)

(52) U.S. Cl.
CPC ......... *H10B 63/845* (2023.02); *H10N 70/066* (2023.02); *H10N 70/011* (2023.02);
(Continued)

(58) Field of Classification Search
CPC .. H10B 63/845; H10N 70/066; H10N 70/826; H10N 70/8833; H10N 70/823; H10N 70/24; H10N 70/011
See application file for complete search history.

(56) References Cited

U.S. PATENT DOCUMENTS

| 7,842,601 | B2 | 11/2010 | Lee et al. |
| 9,196,362 | B2 | 11/2015 | Siau et al. |

(Continued)

FOREIGN PATENT DOCUMENTS

| CN | 114267682 A | 4/2022 |
| CN | 113540115 B | 8/2023 |

(Continued)

OTHER PUBLICATIONS

International Search Report dated Nov. 2, 2023, received in a corresponding foreign application, namely International application No. PCT/CN2023/110155, 7 pages.

(Continued)

*Primary Examiner* — Ratisha Mehta
*Assistant Examiner* — Thaddeus J Kolb
(74) *Attorney, Agent, or Firm* — Scully, Scott, Murphy & Presser, P.C.; Yuanmin Cai

(57) ABSTRACT

A non-volatile memory having a 3D cross-point architecture and twice the cell density is provided in which vertically stacked word lines run in plane (i.e., parallel) to the substrate and bit lines runs perpendicular to the vertically stacked word lines. The vertically stacked word lines are located in a patterned dielectric material stack that includes alternating first dielectric material layers and recessed second dielectric (Continued)

material layers. The first dielectric material layers vertically separate each word line within each vertical stack of word lines and the recessed second dielectric material layers are located laterally adjacent to the word lines. A dielectric switching material layer is located between each word line-bit line combination. Some of the bit lines are located in the dielectric material stack and some of the bit lines are located in an interlayer dielectric material layer.

10 Claims, 11 Drawing Sheets

(52) U.S. Cl.
CPC ........... *H10N 70/24* (2023.02); *H10N 70/823* (2023.02); *H10N 70/826* (2023.02); *H10N 70/8833* (2023.02)

(56) References Cited

U.S. PATENT DOCUMENTS

| | | | |
|---|---|---|---|
| 9,646,688 | B2 | 5/2017 | Scheuerlein |
| 9,728,546 | B2 | 8/2017 | Serov et al. |
| 9,911,790 | B1 | 3/2018 | Shimabukuro et al. |
| 10,424,598 | B2 | 9/2019 | Liu et al. |
| 10,529,778 | B2 | 1/2020 | Vereen et al. |
| 10,777,566 | B2 | 9/2020 | Lue |
| 11,508,741 | B2 * | 11/2022 | Han ................... H10N 70/8828 |
| 2014/0077143 | A1 * | 3/2014 | Seong ................. H10B 63/845 257/2 |
| 2016/0043143 | A1 | 2/2016 | Sakotsubo |
| 2016/0163981 | A1 * | 6/2016 | Toriyama ............. H10N 70/883 257/5 |
| 2017/0309324 | A1 * | 10/2017 | Kumar ............... G11C 13/0007 |
| 2020/0006432 | A1 * | 1/2020 | Grobis .................. H10N 50/01 |
| 2022/0231049 | A1 | 7/2022 | Lin et al. |
| 2023/0292531 | A1 * | 9/2023 | Lin ....................... H10B 63/10 |

FOREIGN PATENT DOCUMENTS

| | | |
|---|---|---|
| CN | 119631588 A | 3/2025 |
| DE | 112023003313 T5 | 5/2025 |
| GB | 2634478 A | 4/2025 |
| KR | 10-2018-0126323 A | 11/2018 |
| WO | 2024/027623 A1 | 2/2024 |

OTHER PUBLICATIONS

Tone, Y., et al., "An Optimum Structure of Scalable Capacitors in 3D Crosspoint Memory Technology", Electronics, Nov. 11, 2021, 10 pp. 10, 2755.
Moyer, B., "Will Monolithic 3D DRAM Happen?", Semiconductor Engineering, Sep. 9, 2021, 22 pages.
Hudec, B., et al., "3D resistive RAM cell design for high-density storage class memory—a review", Science China Information Sciences, Jun. 2016, 21 pages, vol. 59.
Choe, J., "Intel's 2 Generation XPoint Memory—Will it be worth the long wait ahead?", TechInsights, Apr. 30, 2021, 3 pages.
Xu, C., et al., "Modeling and Design Analysis of 3D Vertical Resistive Memory—A Low Cost Cross-Point Architecture", 2014 19th Asia and South Pacific Design Automation Conference (ASP-DAC), Date of Conference: Jan. 20-23, 2014, pp. 825-830.
Choi, E.-S., et al., "Device Considerations for High Density and Highly Reliable 3D NAND Flash Cell in Near Future", 2012 International Electron Devices Meeting, Date of Conference: Dec. 10-13, 2012, pp. 9.4.1-9.4.4.

* cited by examiner

THREE DIMENSIONAL CROSS-POINT NON-VOLATILE MEMORY

BACKGROUND

The present application relates to semiconductor technology, and more particularly to non-volatile memory having a three-dimensional (3D) cross-point architecture and a method of forming the same.

Non-volatile memory (NVM) or non-volatile storage is a type of computer memory that can retain stored information even after the power is removed. In contrast, volatile memory needs constant power in order to retain data. NVMs, such as, for example, resistive random access memory (ReRAM), phase change random access memory (PCRAM), and conductive bridge random access memory (CBRAM), are getting renewed attentions for potential applications to neuromorphic computing with in-memory processing capability which reduces power consumption significantly and eliminates data busing time between memory and the central processing unit (CPU) of conventional complementary metal oxide semiconductor (CMOS) based neuromorphic computing.

ReRAM (or sometimes referred to as RRAM) is considered as a promising technology for electronic synapse devices or memristors for neuromorphic computing as well as high-density and high-speed NVM applications. In neuromorphic computing applications, a resistance memory device such as ReRAM device can be used as a connection (i.e., synapse) between a pre-neuron and a post-neuron, representing the connection weight in form of device resistance.

Cross-point memory architecture, particularly 3D cross-point ReRAM architecture, is particularly attractive. In cross-point memory, a memory cell occurs at an overlap between a word line and a bit line. Specifically, a memory element material such as, and in the case of a ReRAM, a conducting filament is provided between the word line and bit line. 3D cross-point architecture provides density improvement over non-3D cross-point architecture, by stacking the memory cell layer-by-layer.

SUMMARY

A NVM having a 3D cross-point architecture and twice the cell density is provided in which vertically stacked word lines run in plane (i.e., parallel) to the substrate and bit lines runs perpendicular to the vertically stacked word lines. The vertically stacked word lines are located in a patterned dielectric material stack that includes alternating first dielectric material layers and recessed second dielectric material layers. The first dielectric material layers vertically separate each word line within each vertical stack of word lines and the recessed second dielectric material layers are located laterally adjacent to the word lines. A dielectric switching material layer is located between each word line-bit line combination. Some of the bit lines are located in the dielectric material stack and some of the bit lines are located in an interlayer dielectric material layer.

In one aspect of the present application, a NVM cell having a 3D cross-point architecture is provided. In one embodiment, the NVM cell includes a plurality of vertically stacked word lines running parallel to a topmost horizontal surface of a substrate, wherein each word line of the plurality of vertically stacked word lines is vertically separated by a first dielectric material layer, and each word line of the plurality of word lines has a first sidewall that contacts a second dielectric material layer and a second sidewall, opposite the first sidewall, that contacts an interlayer dielectric material layer, wherein the second dielectric material layer has a lateral width that is less than a lateral width of the first dielectric material layer. At least one first bit line is located in a dielectric material stack that includes a portion of each first dielectric material layer and each second dielectric material layer, and at least one second bit line is located in the interlayer dielectric material layer. In accordance with the present application, the at least one first bit line and the at least one second bit line run perpendicular to the plurality of vertically stacked word lines and are in direct contact with the topmost horizontal surface of the substrate. A dielectric switching material layer is located on sidewalls of both of the at least one first bit line and the at least one second bit line, wherein the dielectric switching material layer surrounding the first bit line separates the first bit line from each word line of the plurality of vertically stacked word lines, and the dielectric switching material layer surrounding the second bit line separates the second bit line from each word line of the plurality of vertically stacked word lines.

In embodiments of the present application, the second sidewall of each word line is vertically aligned to an outmost sidewall of each of the first dielectric material layers.

In embodiments, the first dielectric material layer is composed of a dielectric material that is compositionally different from a dielectric material that provides the second dielectric material layer. In one example, the first dielectric material is composed of silicon dioxide and the second dielectric material is composed of silicon nitride.

In embodiments of the present application, a bottommost word line of the plurality of vertically stacked word lines is spaced apart from the substrate by a bottommost first dielectric material layer.

In embodiments of the present application, each word line, the at least one first bit line and the at least one second bit line are composed of an electrically conductive material that is oxygen deficient.

In embodiments of the present application, the dielectric switching material layer is composed of a dielectric metal oxide.

In embodiments of the present application, the substrate includes one or more selector devices.

In embodiments of the present application, the at least one first bit line includes a plurality of first bit lines, and the at least one second bit line includes a plurality of second bit lines.

In embodiments of the present application, the at least one first bit line and the at least one second bit line are arranged in a same row.

In embodiments of the present application, the at least one first bit line has a topmost surface that is coplanar with a topmost surface of each of the at least one second bit line and the interlayer dielectric material layer.

In another aspect of the present application, a method of forming a NVM cell having a 3D cross-point architecture is provided. In one embodiment, the method includes providing at least one patterned dielectric material stack including alternating first dielectric material layers and second dielectric material layers located on top of a substrate. Next, each second dielectric material layer of the at least one patterned dielectric material stack is recessed to provide a recessed second dielectric material layer. A word line is then formed laterally adjacent to each recessed second dielectric material layer. An interlayer dielectric (ILD) material layer is then formed laterally adjacent to the at least one patterned dielectric material stack. Next, a first set of openings is formed in each first dielectric material layer and each recessed second dielectric material layer of the at least one patterned dielectric material stack, and a second set of openings is formed in the ILD material layer, wherein the first set of openings and the second set of openings physically expose the substrate. A dielectric switching material layer is then formed lining sidewalls of both of the first set of openings and the second set of openings, and thereafter a first bit line is formed in a remaining portion of each of the first set of openings and a second bit line is formed in a remaining portion of the second set of openings, wherein the first bit line and the second bit line are in direct physical contact with the substrate and are laterally surrounded by the dielectric switching material layer.

In embodiments of the present application, each of the first dielectric material layers has a lateral width that is greater than a lateral width of the recessed second dielectric material layer.

In embodiments of the present application, the recessing includes an isotropic lateral etch and a gap is formed laterally adjacent to the recessed second dielectric material layer.

In embodiments of the present application, the forming the word line includes depositing an electrically conductive material that is oxygen deficient, lateral etching the electrically conductive material, and cutting the electrically conductive material that is formed around ends of each recessed second dielectric material layer of the at least one patterned dielectric material stack.

In embodiments of the present application, each word line has a first sidewall that contacts a sidewall of a laterally adjacent recessed second dielectric material layer, and a second sidewall opposite the first sidewall, which is vertically aligned to an outmost sidewall of each of the first dielectric material layers.

In embodiments of the present application, the forming the dielectric switching material layer includes depositing, by atomic layer deposition, a dielectric metal oxide in each of the first set of openings and the second set of openings, and removing the dielectric material oxide from a bottom of each of the first set of openings and the second set of openings to physically expose the substrate.

In embodiments of the present application, the first dielectric material layer is composed of a dielectric material that is compositionally different from a dielectric material that provides the second dielectric material layer.

In embodiments of the present application, each of the word lines runs parallel to a horizontal surface of the substrate; and the first bit line and the second bit line run perpendicular to each word line.

In embodiments of the present application, the forming the first set of openings and the second set of openings includes lithography and etching.

In embodiments of the present application, the forming of the at least one patterned dielectric material stack includes forming a dielectric material stack of alternating blanket layers of a first dielectric material and a second dielectric material, and patterning, by lithography and etching, the dielectric material stack.

DETAILED DESCRIPTION

Figure 1:
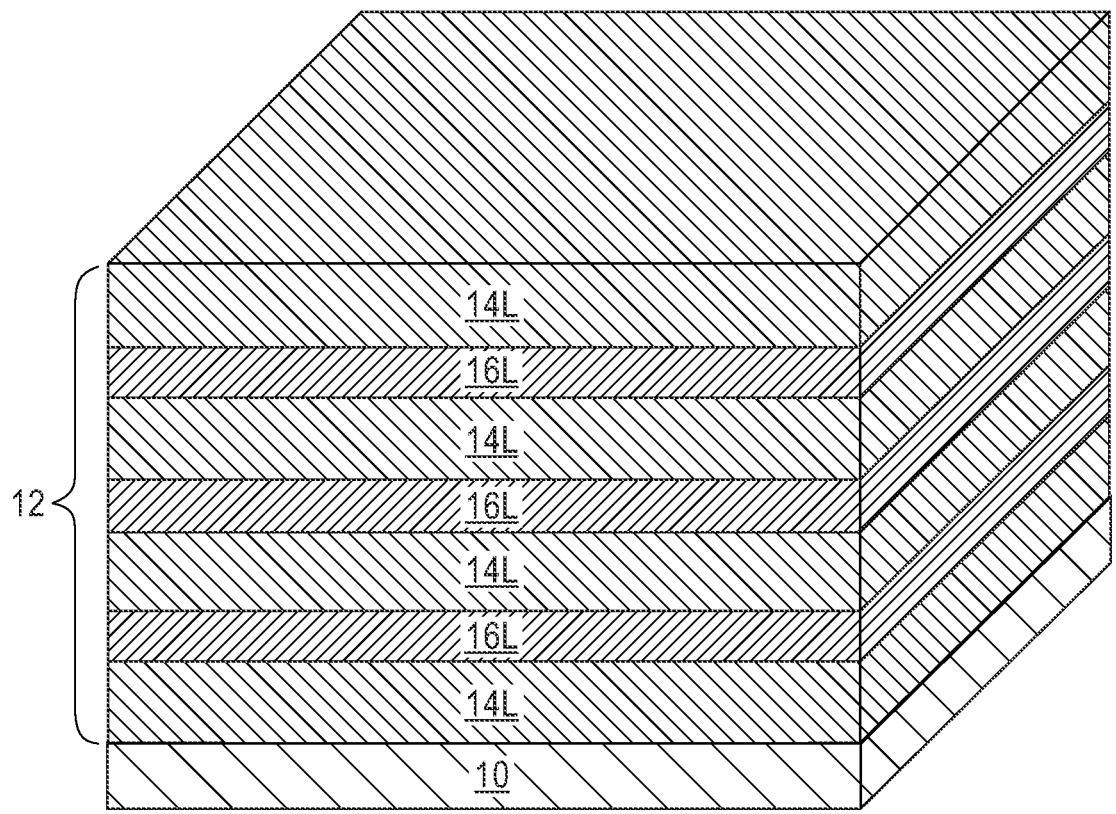
FIG. 1 is a 3D view of an exemplary structure that can be employed in accordance with an embodiment of the present application, the exemplary structure including a dielectric material stack of alternating blanket layers of a first dielectric material and a second dielectric material located above a substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In conventional 3D cross-point ReRAM architecture, integration issues and cell density penalties are common problems that occur. The present application over comes the integration issues and cell density penalties of the conventional prior art by providing a NVM having a 3D cross-point architecture in which vertically stacked word lines run in plane (i.e., parallel) to the substrate and bit lines runs perpendicular to the vertically stacked word lines. Stated in other terms, the length of the word lines run parallel to the substrate, and the length of the bit lines run perpendicular to the word lines. The vertically stacked word lines are located in a patterned dielectric material stack that includes alternating first dielectric material layers and recessed second dielectric material layers. The first dielectric material layers vertically separate each word line within each vertical stack of word lines and the recessed second dielectric material layers are located laterally adjacent to the word lines. A dielectric switching material layer is located between each word line-bit line combination. Some of the bit lines are located in the dielectric material stack and some of the bit lines are located in an interlayer dielectric material layer.

Referring first to FIG. 1, there is illustrated an exemplary structure that can be employed in accordance with an embodiment of the present application. The illustrated exemplary structure shown in FIG. 1 incudes a dielectric material stack 12 of alternating blanket layers of a first dielectric material and a second dielectric material located above a substrate 10. The term "blanket layer" denotes a layer that is formed entirely over the substrate 10 without being subjected to a patterning process. Each blanket layer of first dielectric material in the dielectric material stack 12 can be referred to as a first dielectric material blanket layer 14L and each blanket layer of second dielectric material in the dielectric material stack can be referred to as a second dielectric material blanket layer 16L. In the present application, each second dielectric material blanket layer 16L is sandwiched between a bottom first dielectric material blanket layer and a top first dielectric material blanket layer. In the present application, the dielectric material stack includes "n" number of second dielectric material blanket layers 16L and "n+1" number of first dielectric material blanket layers 14L, wherein "n" is an integer starting at 2. In the drawings and by way of one example, the dielectric material stack 12 includes four first dielectric material blanket layers 14L and three second dielectric material blanket layers 16L.

The substrate 10 can be a front-end-of-the-line (FEOL) level, a middle-of-the line (MOL) level, a lower interconnect level or any combination thereof; each combination includes the FEOL as the lowest level of the substrate 10. In one example, the substrate 10 is a FEOL level and a MOL level. In another example, the substrate 10 is a FEOL level, a MOL level and a lower interconnect level. An FEOL level is a level of a semiconductor structure that contains one or more semiconductor devices such as, for example, one or more selector devices such as, for example, transistors and/or diodes, formed on, or within, a semiconductor substrate. The one or more selector devices typically include an array of selector devices that are arranged in rows and columns. A MOL level includes one or more MOL electrically conductive structures (via and/or lines) embedded in a MOL dielectric material layer. A lower interconnect level includes one or more interconnect structures embedded in an interconnect dielectric material. The FEOL level, the MOL level and/or the lower interconnect level that can be used to provide substrate 10 include materials that are well known to those skilled in the art, and such levels can be formed utilizing techniques that are also well known to those skilled in the art. So as not to obscure the method of the present application, the materials and processing techniques used to provide the FEOL level, the MOL level and/or the lower interconnect level are not described herein.

The first dielectric material and the second dielectric material employed in the present application are electrically insulating materials such as, for example, silicon dioxide, silicon nitride, silicon oxynitride, silicon carbonitride, silicoboron carbonitride, or silicon carboxide, with the proviso that the first dielectric material is compositionally different from the second dielectric material. The compositional difference between the first dielectric material and the second dielectric material is needed to provide etch selectivity between the two different dielectric materials such that second dielectric material can be etched selectively to the first dielectric material. In one example, each first dielectric material blanket layer 14L of the dielectric material stack 12 is composed of silicon dioxide, while each second dielectric material blanket layer 16L of the dielectric material stack 12 is composed of silicon nitride.

The dielectric material stack 12 including each first dielectric material blanket layer 14L and each second dielectric material blanket layer 16L can be formed by, for example, chemical vapor deposition (CVD), plasma enhanced chemical vapor deposition (PECVD), physical vapor deposition (PVD) or atomic layer deposition (ALD). In some embodiments, the first dielectric material blanket layers 14L and the second dielectric material blanket layers 16L can be formed utilizing a same deposition process. In one example, the first dielectric material blanket layers 14L and the second dielectric material blanket layers 16L can be formed by CVD. In other embodiments, the first dielectric material blanket layers 14L and the second dielectric material blanket layers 16L can be formed utilizing different deposition processes. In one example, the first dielectric material blanket layers 14L can be formed by CVD, while the second dielectric material blanket layer 16L can be formed by ALD.

Each first dielectric material blanket layer 14L and each second dielectric material blanket layer 16L can have a thickness from 10 nm to 100 nm; although other thicknesses for each first dielectric material blanket layer 14L and each second dielectric material blanket layer 16L are contemplated and can be used as the thickness of the first dielectric material blanket layers 14L and second dielectric material blanket layers 16L in the present application. Each first dielectric material blanket layer 14L can have a same, or a different, thickness from each other. Likewise, each second dielectric material blanket layer 14L can have a same, or a different, thickness from each other. Each first dielectric material blanket layer 16L can have a same or a different thickness from each second dielectric material blanket layer 16.

Figure 2:
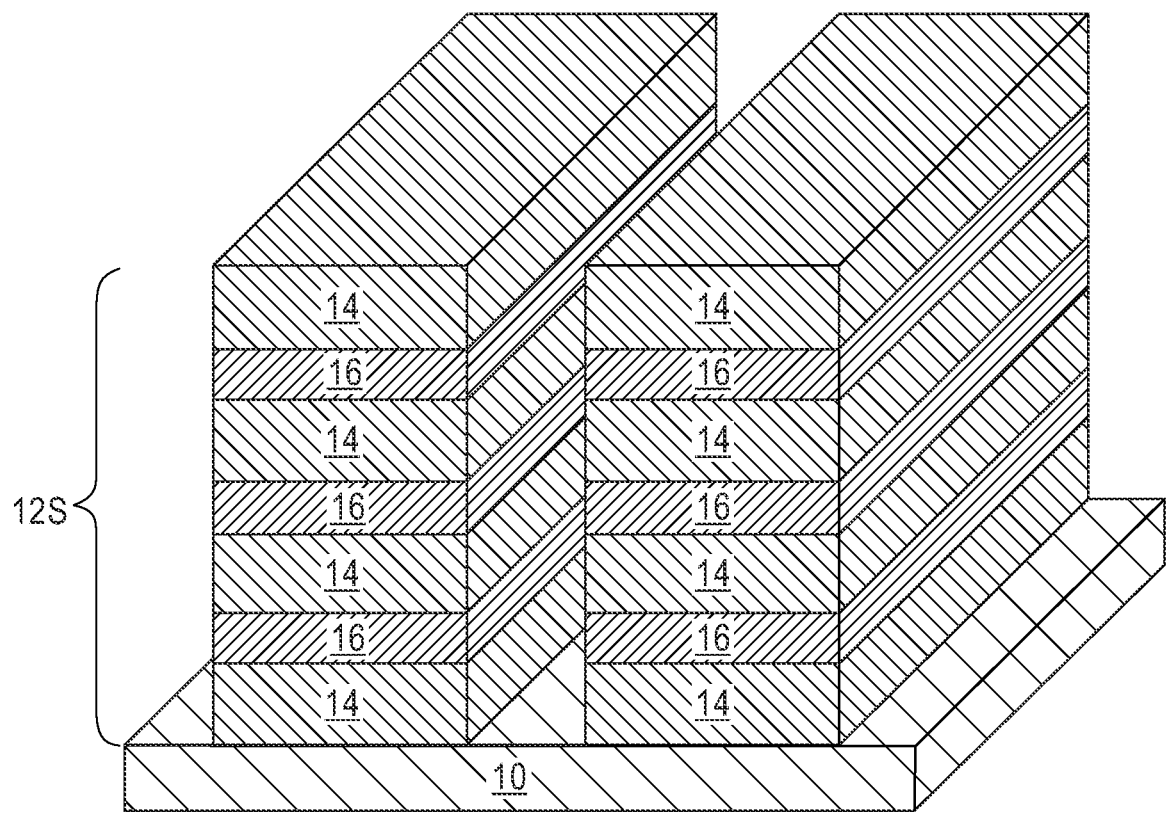
FIG. 2 is a 3D view of the exemplary structure of FIG. 1 after patterning the dielectric material stack to provide at least one patterned dielectric material stack including alternating layers of the first dielectric material and the second dielectric material.

Referring now to FIG. 2, there is illustrated the exemplary structure of FIG. 1 after patterning the dielectric material stack 12 including each first dielectric material blanket layer 14L and each second dielectric material blanket layer 16L to provide at least one patterned dielectric material stack 12S including alternating layers of the first dielectric material and the second dielectric material. Each patterned blanket layer of the first dielectric material is referred to herein as a first dielectric material layer 14 and each patterned blanket layer of the second dielectric material is referred to herein as a second dielectric material layer 16.

The number of patterned dielectric material stacks 12S that is formed can vary and is not limited to two as is exemplified in FIG. 2. In embodiments, a single patterned dielectric material stack 12S can be formed, while in other embodiments, two or more patterned dielectric material stacks 12S can be formed. The shape of each patterned dielectric material stack 12S is typically a square, or a rectangle. Each patterned dielectric material stack 12S can have a length from 50 nm to 10000 nm, and a lateral width from 90 nm and 1000 nm; although other lengths and widths are contemplated and can be used in the present application for each patterned dielectric material stack 12S.

The patterning that provides the at least one patterned dielectric material stack 12S includes lithography and etching. Lithography includes depositing at least a photoresist material on the dielectric material stack 12, exposing the as deposited photoresist material to a pattern of irradiation (in the present application and to form the patterned dielectric material stacks 12S shown in FIG. 2, the pattern of irradiation is a rectangular or square cell pattern), and developing the exposed as deposited photoresist material. In embodiments, one or more photolithographic masking layers such as, for example, a bottom antireflective coating (BARC), can be formed between dielectric material stack 12 and the as deposited photoresist material. In FIG. 2, the as deposited photoresist material and optional one or more photolithographic masking layers are not shown since both the as deposited photoresist material and optional one or more photolithographic masking layers are removed from the structure after the dielectric material stack 12 is patterned. The etching step used to pattern the dielectric material stack 12 includes a wet etching process or a dry etching process. The etch stops on a topmost horizontal surface of substrate 10. In one example, the etch includes fluorine based plasma etching. The etching of dielectric material stack 12 is much easier than etching through a material stack that includes alternating layers of a dielectric material and an electrically conductive metal-containing material as is typically used in the prior art in forming a NVM containing a 3D architecture.

Figure 3:
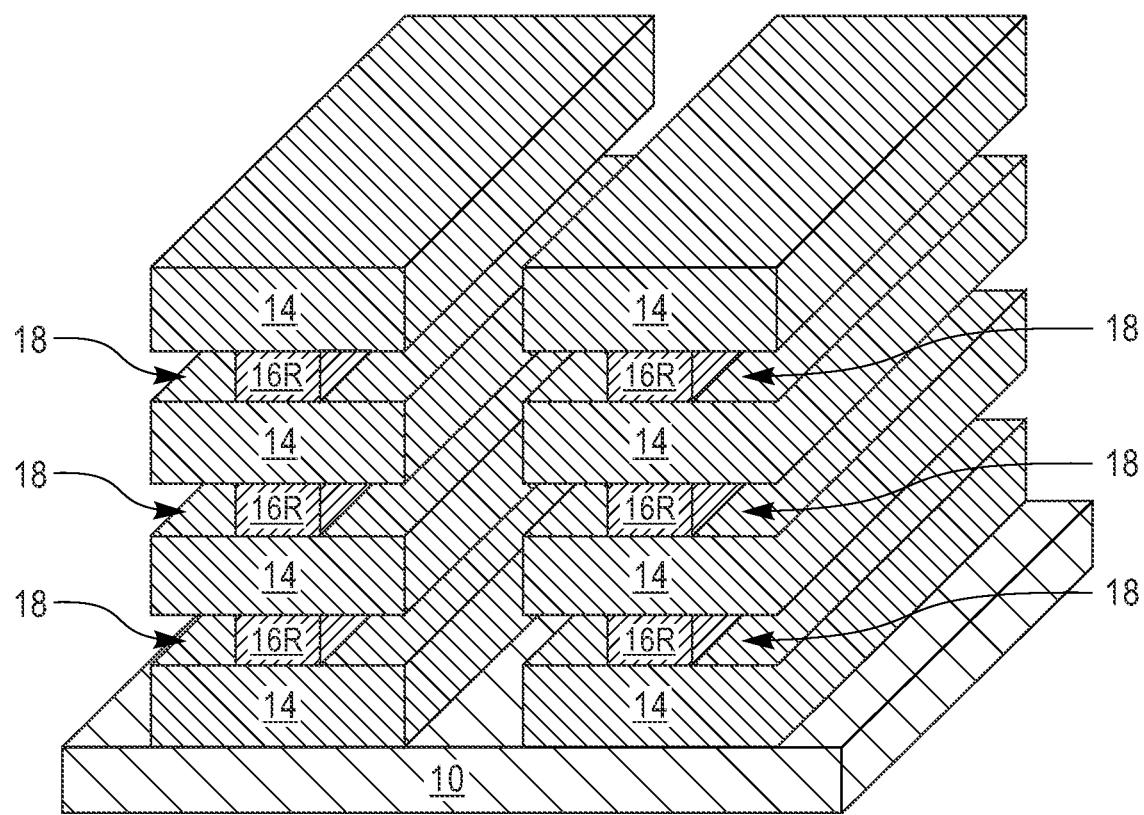
FIG. 3 is a 3D view of the exemplary structure of FIG. 2 after recessing each second dielectric material layer of the at least one patterned dielectric material stack to provide recessed second dielectric material layers.

Referring now to FIG. 3, there is illustrated the exemplary structure of FIG. 2 after recessing each second dielectric material layer 16 of the at least one patterned dielectric material stack 12S to provide recessed second dielectric material layers 16R. Each recessed second dielectric material layer 16R has a lateral width that is less than the lateral width of each second dielectric material layer 16 and each first dielectric material layer 14. In one example, each recessed second dielectric material layer 16R has a lateral width from 25 nm to 100 nm.

The recessing provides a gap 18 that is located laterally adjacent to each recessed second dielectric material layer 16R, and each gap 18 is located between a bottom first dielectric material layer and a top first dielectric material layer as is shown in FIG. 3. Each gap 18 represents an indentation in the at least one patterned dielectric material stack 12S that will subsequently house a word line.

The recessing step is performed utilizing an isotropic lateral etching process that is selective in removing the second dielectric material mentioned above relative to the first dielectric material mentioned above. In one example, and when the first dielectric material is composed of silicon dioxide, and the second dielectric material is composed of silicon nitride, the isotropic lateral etch can include hot phosphoric acid wet etching or fluorine based plasma etching which is commercially available and widely used in the industry.

Figure 4:
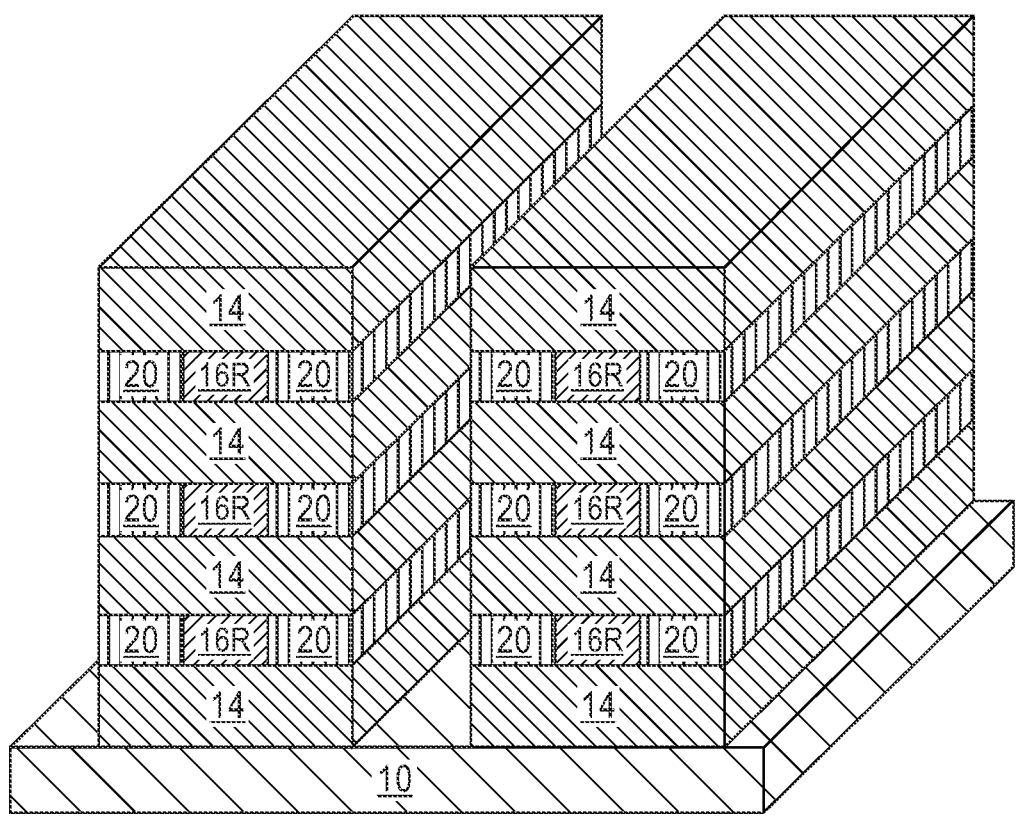
FIG. 4 is a 3D view of the exemplary structure of FIG. 3 after forming a word line laterally adjacent to each recessed second dielectric material layer.

Referring now to FIG. 4, there is illustrated the exemplary structure of FIG. 3 after forming a word line 20 laterally adjacent to each recessed second dielectric material layer 16R. Each word line 20 has a first sidewall that contacts a sidewall of a laterally adjacent recessed second dielectric material layer 16R, and a second sidewall opposite the first sidewall, which is vertically aligned to an outmost sidewall of the first dielectric material layers 14. Each word line 20 is composed of an electrically conductive material that is oxygen deficient. Examples of such electrically conductive materials that can be employed in the present application in providing the word lines 20 include, but not limited to, titanium nitride (TiN), tantalum nitride (TaN), ruthenium (Ru), ruthenium nitride (RuN), a ruthenium-tantalum alloy (RuTa), RuTaN, cobalt (Co), nickel (Ni), copper (Cu), tungsten (W), tungsten nitride (WN), silver (Ag), platinum (Pt), palladium (Pd), or aluminum (Al).

Each word line 20 can be formed by first depositing the electrically conductive material utilizing a deposition process such as, for example, CVD, PECVD, PVD or ALD. The deposition process fills in an entirety of each of the gaps 18 such that the electrically conductive material is flush with a sidewall of the laterally adjacent recessed second dielectric material layer 16R. Following the deposition of the electrically conductive material, a lateral etching technique is used to remove portions of the as deposited electrically conductive material that are located outside each of the gaps 18. After this lateral etch, the electrically conductive material that surrounds each end segment of each of the recessed second dielectric material layers 16R (the electrically conductive material on the left and right side of each recessed second dielectric material layer 16R with each patterned dielectric material stack 12S are connected) is removed utilizing a metal cutting process that includes lithography and etching. The metal cutting process ensures that the electrically conductive material that remains in each gap 18 on the left hand side of each patterned dielectric material stack 12S is not connected to the electrically conductive material that remains in each gap 18 that is located on the right hand side of each patterned dielectric material stack.

The remaining and now separated electrically conductive material in the gaps 18 defines the word lines 20 of the present application.

Within each patterned dielectric material stack 12S, the word lines 20 are vertically stacked (in a column) and the vertically stacked word lines 20 are vertically separated by a portion of the patterned first dielectric material layer 12. Rows of word lines 20 within the at least one patterned dielectric material stack 12S are laterally separated by the recessed second dielectric material layer 16R. The plurality of vertically stacked word lines can be arranged in rows and columns.

Figure 5:
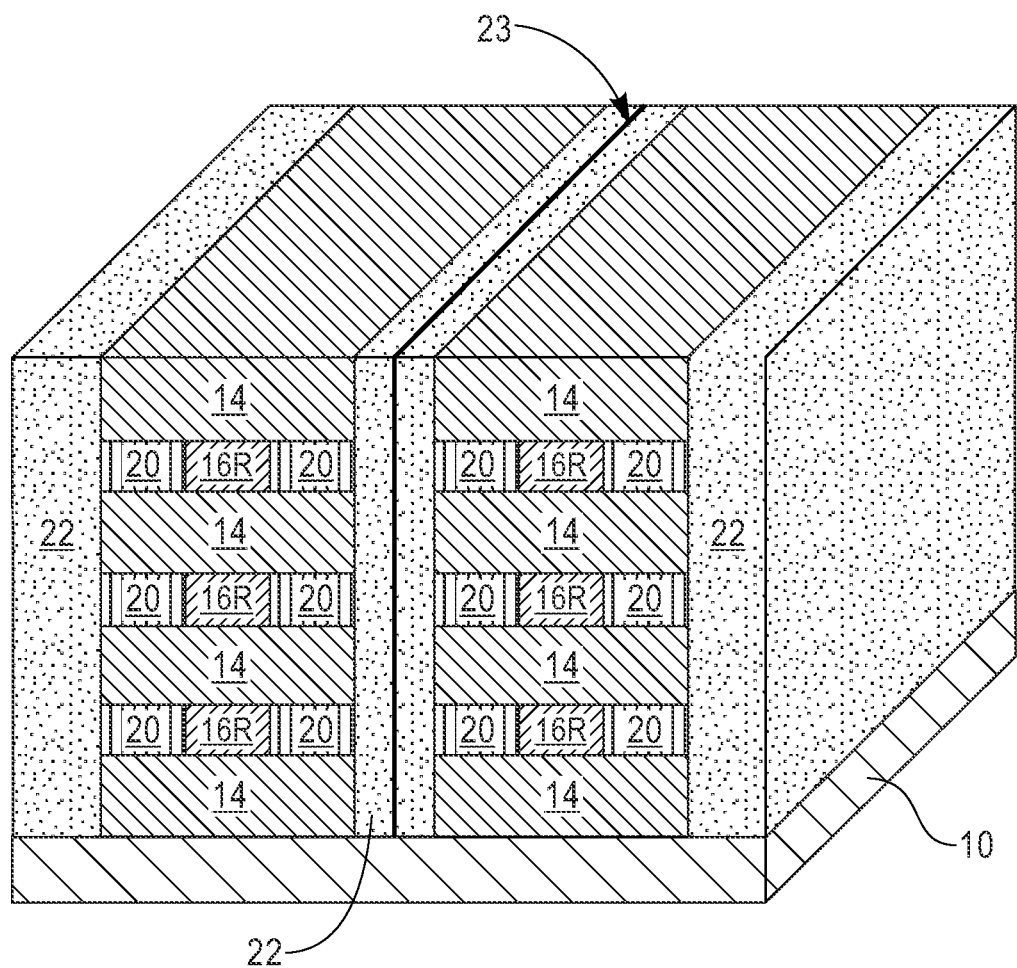
FIG. 5 is a 3D view of the exemplary structure of FIG. 4 after forming an interlayer dielectric (ILD) material layer laterally adjacent to the at least one patterned dielectric material stack.

Referring now to FIG. 5, there is illustrated the exemplary structure of FIG. 4 after forming an interlayer dielectric (ILD) material layer 22 laterally adjacent to the at least one patterned dielectric material stack 12S. The ILD material layer 22 has a topmost surface that is coplanar with a topmost surface of a topmost first dielectric material layer. In some embodiments, a seam 23 can be formed in the ILD material layer 22 that is located between two laterally adjacent patterned dielectric material stacks 12S. This seam will not be illustrated in the remaining drawings of the present application.

The ILD material layer 22 is composed of a dielectric material that has electrically insulating properties including, but not limited to, silicon dioxide, silicon nitride, undoped silicate glass (USG), fluorosilicate glass (FSG), borophosphosilicate glass (BPSG), a spin-on low-k dielectric material, a chemical vapor deposition (CVD) low-k dielectric material or any combination thereof including multilayers. The term "low-k" as used throughout the present application denotes a dielectric material that has a dielectric constant of less than 4.0. All dielectric constants mentioned herein are measured in a vacuum unless otherwise stated. Illustrative low-k dielectric materials that can be used include, but are not limited to, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The ILD material layer 22 can be formed utilizing a deposition process including, for example, CVD, PECVD, ALD, evaporation, or spin-on coating. A planarization process such as, for example, chemical mechanical polishing (CMP) can follow the deposition of the dielectric material that provides the ILD material layer 22.

Figure 6:
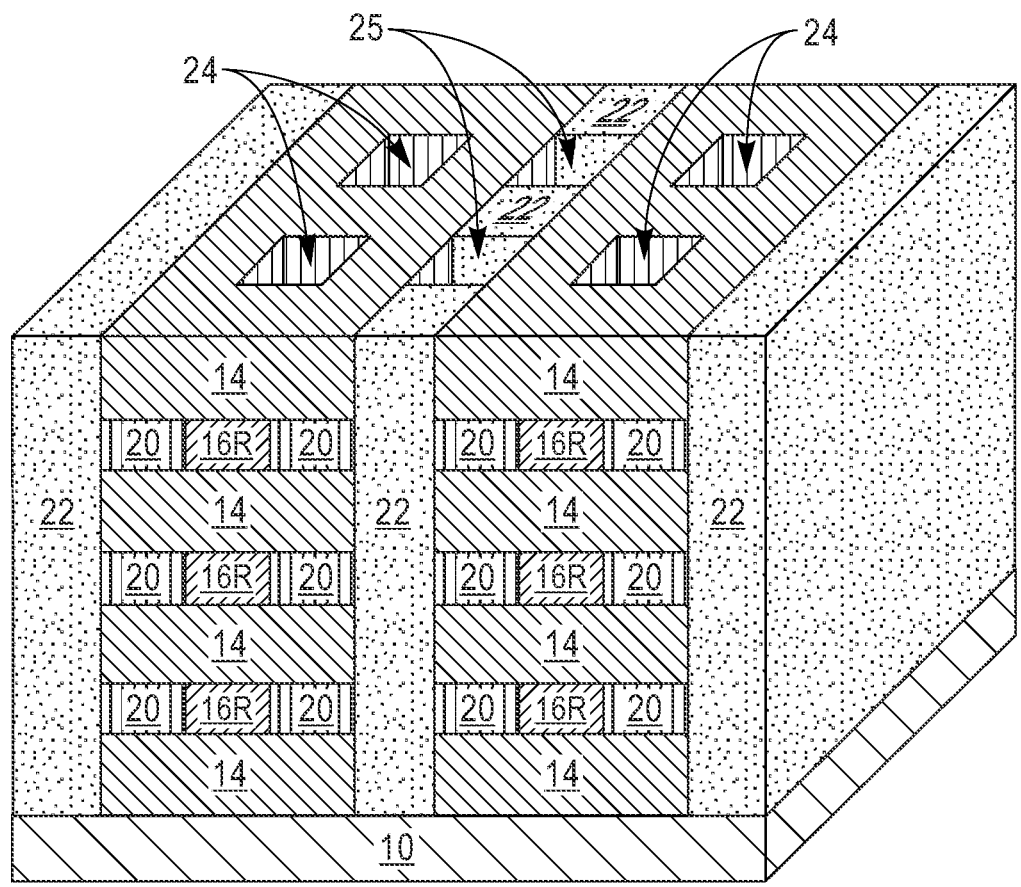
FIG. 6 is a 3D view of the exemplary structure of FIG. 5 after forming a first set of openings in each first dielectric material layer and in each recessed second dielectric material layer of the at least one patterned dielectric material stack, and a second set of openings in the ILD material layer, wherein the first set of openings and the second set of openings physically expose the substrate.

Referring now to FIG. 6, there is illustrated the exemplary structure of FIG. 5 after forming a first set of openings 24 in the first dielectric material layers 14 and in the recessed second dielectric material layers 16R of the at least one patterned dielectric material stack 12S, and a second set of openings 25 in the ILD material layer 22, wherein the first set of openings 24 and the second set of openings 25 extend down, and physically expose the substrate 10. It is noted that the first set of openings 24 while passing through the first dielectric material layers 14 and the recessed second dielectric material layers 16R do not pass through any of the word lines 20. The first set of openings 24 do however expose a sidewall of each vertically stacked word line 20 in each patterned dielectric material stack 12S.

The first set of openings 24 and the second set of openings 25 can be formed by lithography and etching. With respect to the lithographic step, hole patterns are formed in the photoresist material and those hole patterns are transferred into the underlying structure as defined above. With respect to the etching step, one or more etching processes including dry etching and/or chemical wet etching can be employed. The one or more etching processes used to form the first set of openings 24 and the second set of openings 25 stop on a surface of the substrate 10 and each first set of openings 24 and the second set of openings 25 will subsequently house a dielectric switching material layer and a bit line. In some embodiments, the first set of openings 24 and the second set of openings 25 can be formed at the same time. In other embodiments, the first set of openings 24 and the second set of openings 25 are formed a different times, e.g., the first set of openings 24 can be formed first, and then the second set of openings 25 can be formed, or vice versa. When the first set of openings 24 and the second set of openings 25 are formed a different times, the etch used to form openings 24 can be the same or different from the etch used to form openings 25. The number of openings 24 can vary (in the present application at least one, more typically two or more openings 24 are formed), likewise the number of openings 25 can vary (in the present application least at one, more typically two or more openings 25 are formed). The number of openings that provide the first set of openings 24 can be the same as, or different from, the number of openings that provide the second set of openings 25. The first set of openings 24 and the second set of openings 25 can be formed in rows and columns as is illustrated in FIG. 6.

Figure 7A:
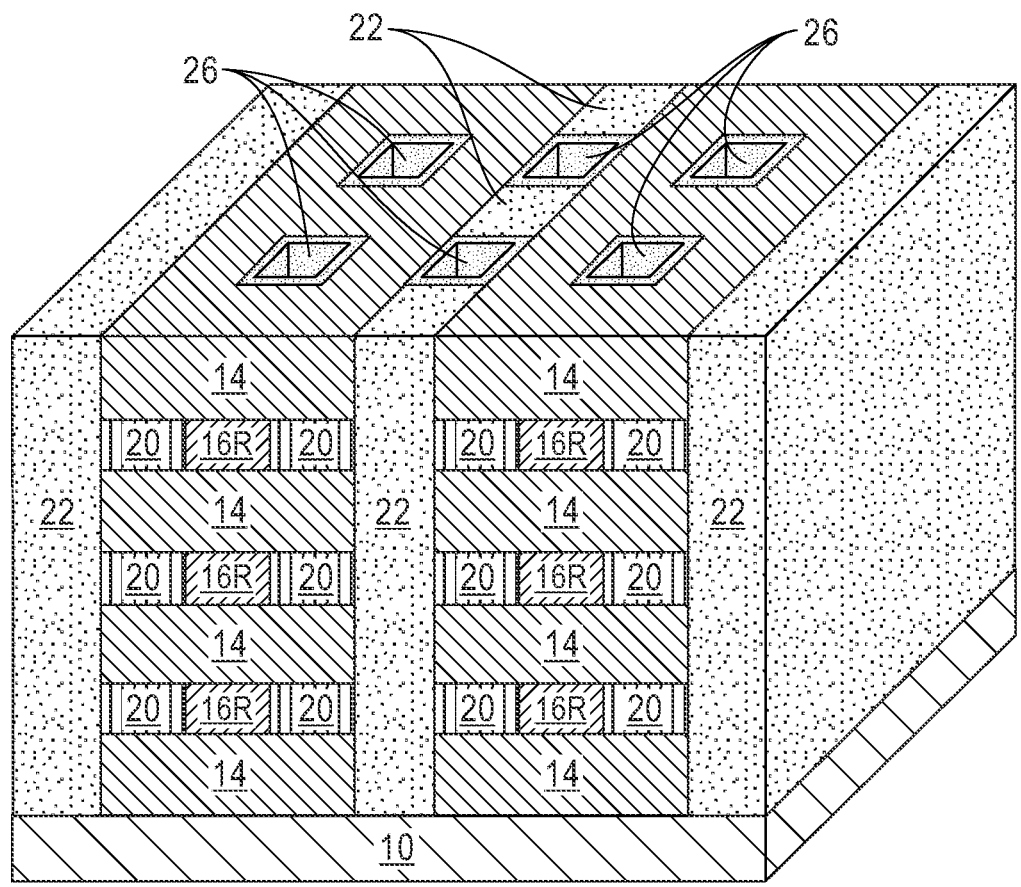
FIG. 7A is 3D view of the exemplary structure of FIG. 6 after forming a dielectric switching material layer lining sidewalls of both of the first set of openings and the second set of openings.
Figure 7B:
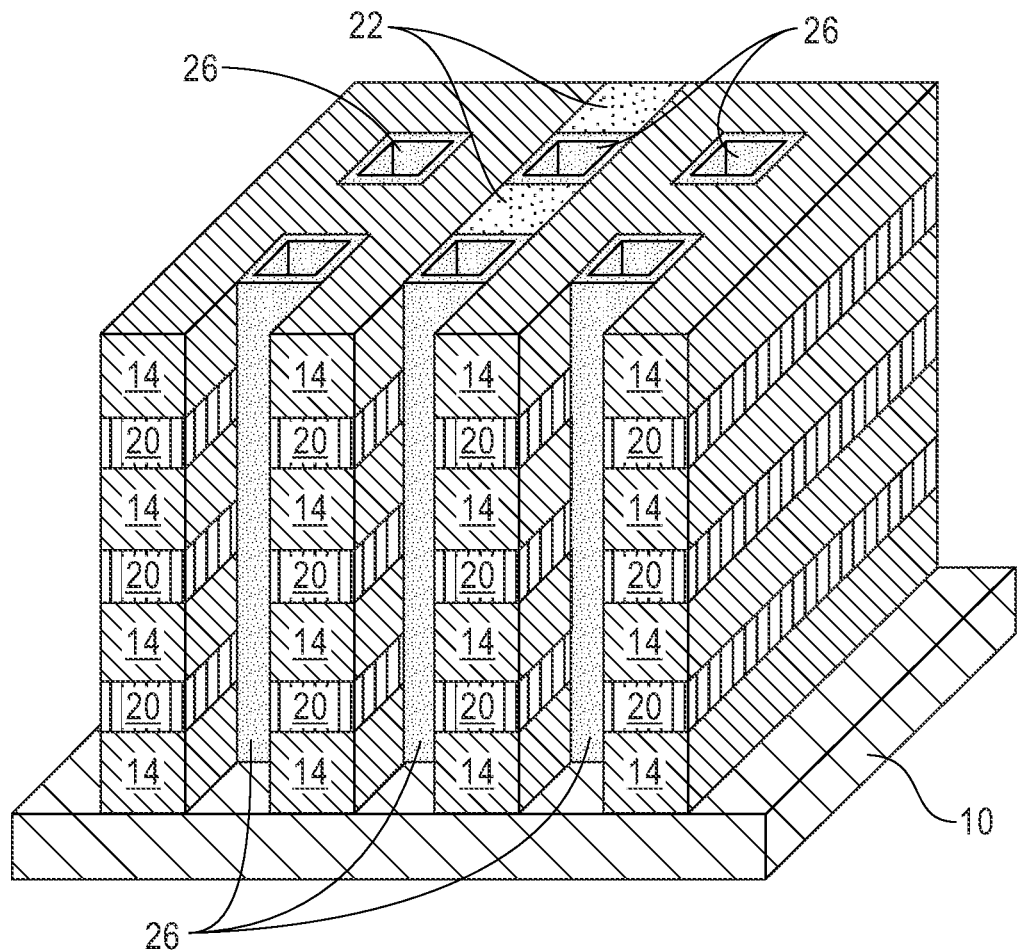
FIG. 7B is a 3D view of the exemplary structure shown in FIG. 7A illustrating the dielectric switching material layer that is formed in both of the first set of openings and the second set of openings; in this drawing a portion of each first dielectric material layer and each recessed second dielectric material layer that is located in the front side of the structure is not shown to view the dielectric switching material layers.

Referring now to FIG. 7A, there is illustrated the exemplary structure of FIG. 6 after forming a dielectric switching material layer 26 lining sidewalls of each of the first set of openings 24 and the second set of openings 25. FIG. 7B illustrates the exemplary structure shown in FIG. 7A illustrating the dielectric switching material layer 26 that is formed in each of the first set of openings 24 and the second set of openings 25; in this drawing each first dielectric material layer 14 and each recessed second dielectric material layer 16R that is located in the front side of the structure is not shown to better view the dielectric switching material layers 26. In the present application, each dielectric switching material layer 26 contacts a sidewall of the vertically stacked word lines 20.

Each dielectric switching material layer 26 can be composed of a dielectric metal oxide material that has a dielectric constant of 4.0 or greater. Each dielectric switching material layer 26 is electrically insulating at this point of the present application and during operational use, the dielectric switching material layers 20 can be converted into a filament that is electrically conducting. After use, the electrically conductive filament return back to its' insulating state. Examples of dielectric metal oxides that can be employed as dielectric switching material layers 26 include, but are not limited to, hafnium oxide ($HfO_x$), tantalum oxide ($TaO_x$), titanium oxide ($TiO_x$), aluminum oxide ($AlO_x$), silicon dioxide ($SiO_2$) or combinations thereof, wherein x is from 1.5 to 3.5. The dielectric metal oxide that provides each dielectric switching material layer 26 is formed by ALD, and following the ALD process an etch can be used to remove the dielectric metal oxide that is formed on the surface of the substrate 10 in each of the first set of openings 24 and the second set of openings 25. Each dielectric switching material layer 26 within the first set of openings 24 thus lines the first set of openings 24, and each dielectric switching material layer 26 within the second set of openings 25 thus lines the second set of openings 25. The dielectric switching material layer 26 can have a thickness from 1 nm to 30 nm; other thicknesses however are contemplated can be used as the thickness of the dielectric switching material layer 26 as long as the dielectric switching material layer 26 does not fill in the entirety of the volume of the openings that are provide the first set of openings 24 and the openings that provide the second set of openings 25.

Figure 8A:
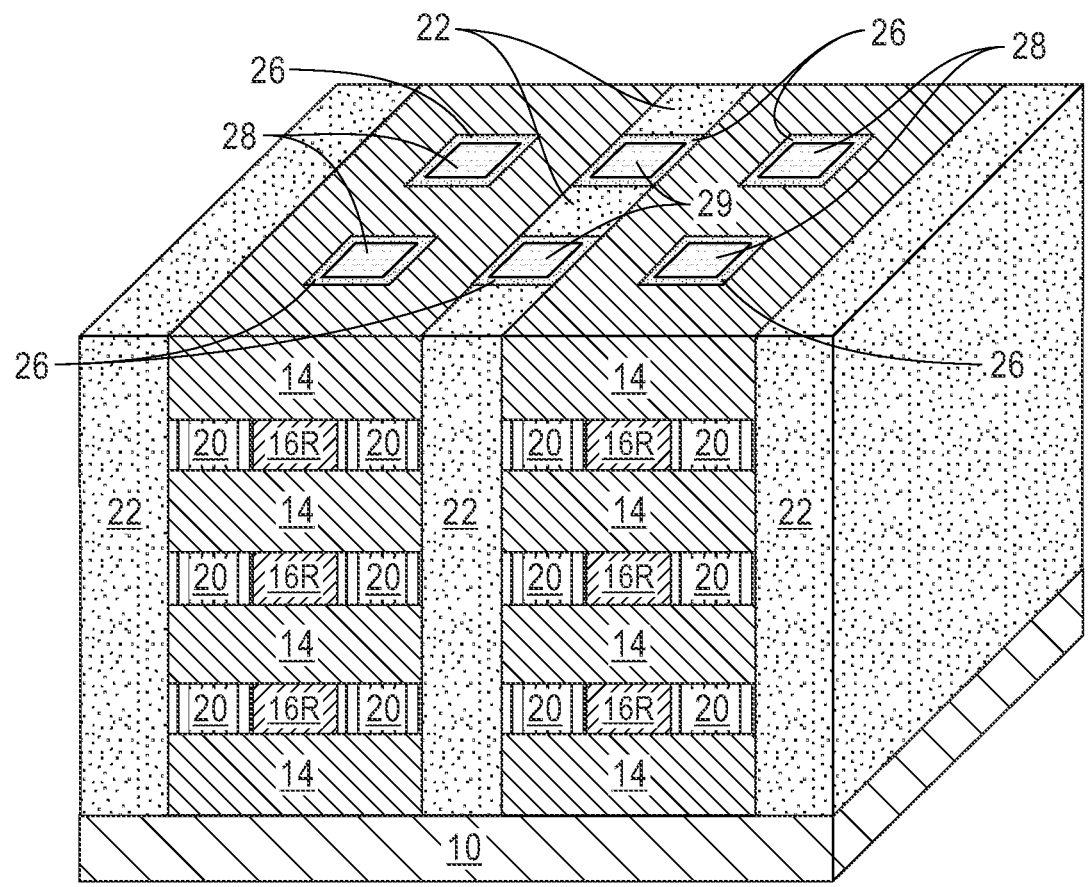
FIG. 8A is 3D view of the exemplary structure of FIG. 7A after forming a first bit line in a remaining portion of each of the first set of openings and a second bit line in a remaining portion of each of the second set of openings, wherein each first and second bit line is laterally surrounded by one of the dielectric switching material layers and has a bottommost surface in direct contact with a surface of the substrate.
Figure 8B:
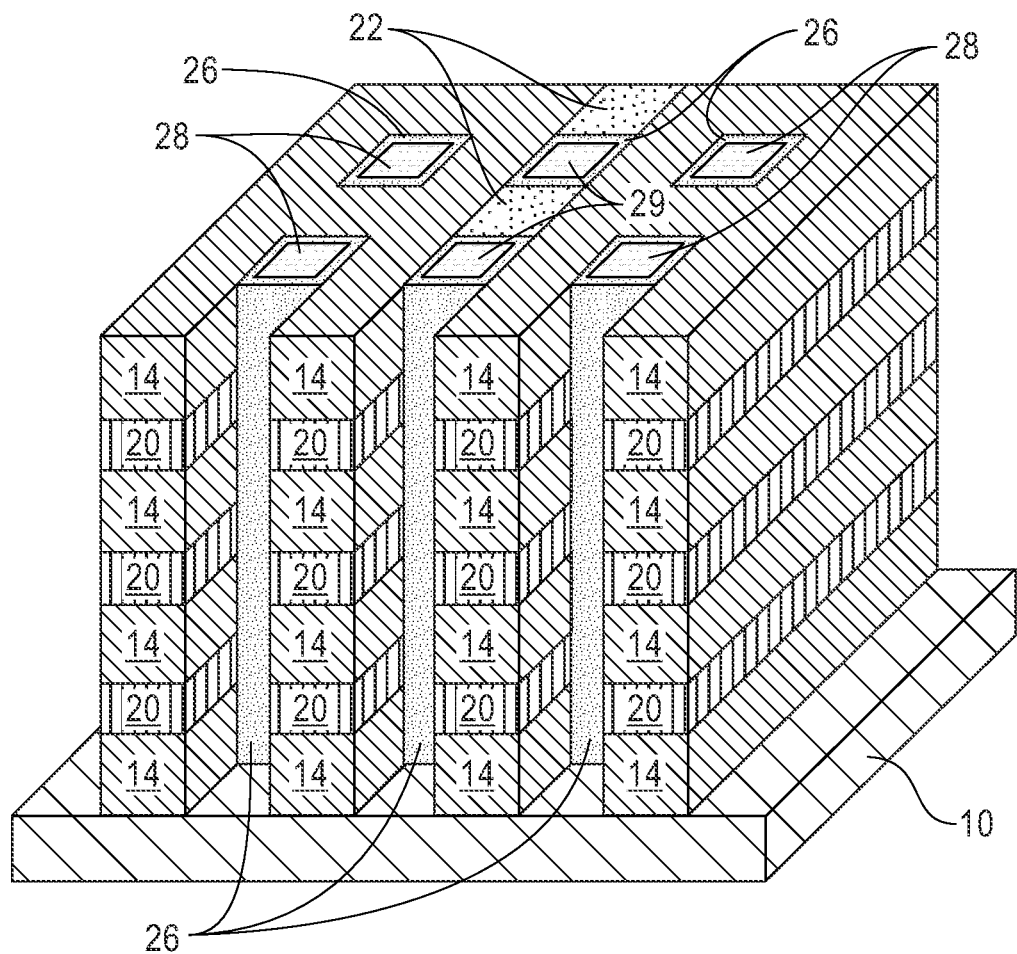
FIG. 8B is a 3D view of the exemplary structure shown in FIG. 8A illustrating the dielectric switching material layer and bit line that is formed in each of the first set of openings and the second set of openings; in this drawing a portion of each first dielectric material layer and each recessed second dielectric material layer that is located in the front side of the structure is not shown to better view the dielectric switching material layers that surround the first and second bit lines.

Referring now to FIG. 8A is 3D, there is illustrated the exemplary structure of FIG. 7A after forming a first bit line 28 in a remaining portion of each of the first set of openings 24 and a second bit line 29 in the second set of openings 25, wherein each first bit line 28 and each second bit line 29 is laterally surrounded by one of the dielectric switching material layers 28 and has a bottommost surface in direct contact with a surface of the substrate 10. FIG. 8B shows the exemplary structure shown in FIG. 8A illustrating the dielectric switching material layer 26 and first bit line 28 that is formed in each of the first set of openings 24 and the second bit line 29 that is formed the second set of openings 25; in this drawing each first dielectric material layer 14 and each recessed second dielectric material layer 16R that is located in the front side of the structure is not shown to better view the dielectric switching material layers 26 that surround the first bit lines 28 and the second bit lines 29.

Each first bit line 28 and each second bit line 29 are composed of one of the electrically conductive materials that are mentioned above for the word lines 20. The electrically conductive material that provides each first bit line 28 and each second bit line 29 can be compositionally the same as, or compositionally different from, the electrically conductive material that provides the word lines 20. The electrically conductive material can be formed utilizing one of the deposition processes mentioned above in forming the word lines 20. After depositing the electrically conductive material that provides each first bit line 28 and each second bit line 29, a planarization process such as, for, example, CMP, can be used to provide a planar structure as is shown in FIGS. 8A and 8B in which a topmost surface of each first bit line 28 and each second bit line 29 is coplanar with a topmost surface of the ILD material layer 22 and a topmost surface of the topmost first dielectric material layer 14.

As is shown, each word line 20 runs in a first direction that is parallel to a horizontal topmost surface of substrate 10, while each first bit line 28 and each second bit line 29 run in a second direction that is different from the first direction and perpendicular to vertically stacked word line 20; thus providing a cross-point memory. As is further shown, each first bit line 28 and each second bit line 29 has a bottommost surface that is in direct physical contact with the substrate 10.

Figure 9B:
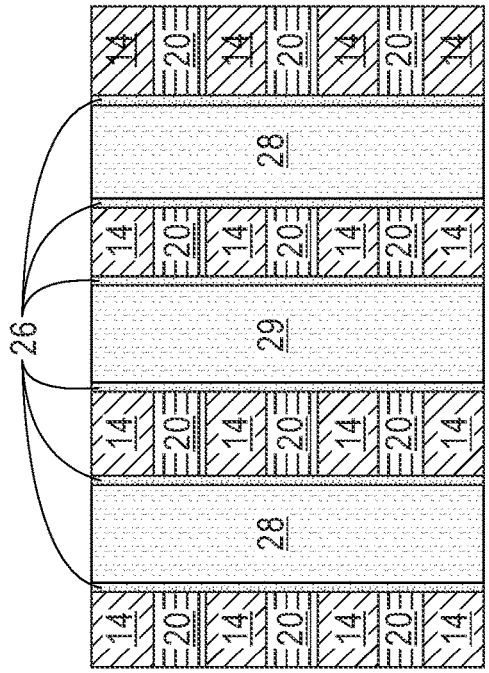
FIG. 9B is a cross sectional view along cut X-X shown in FIG. 9A.
Figure 9C:
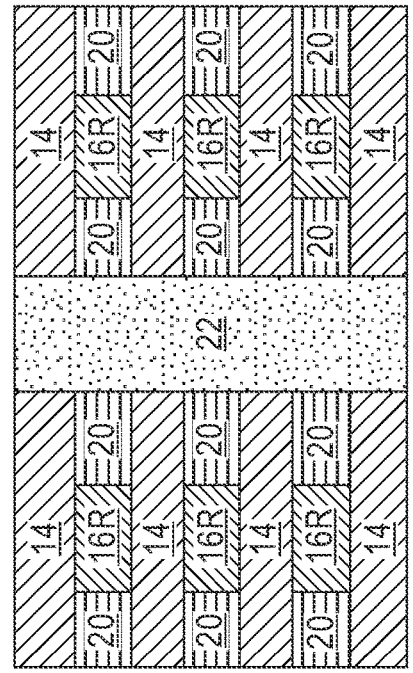
FIG. 9C is a cross sectional view along cut Y-Y shown in FIG. 9A.
Figure 9A:
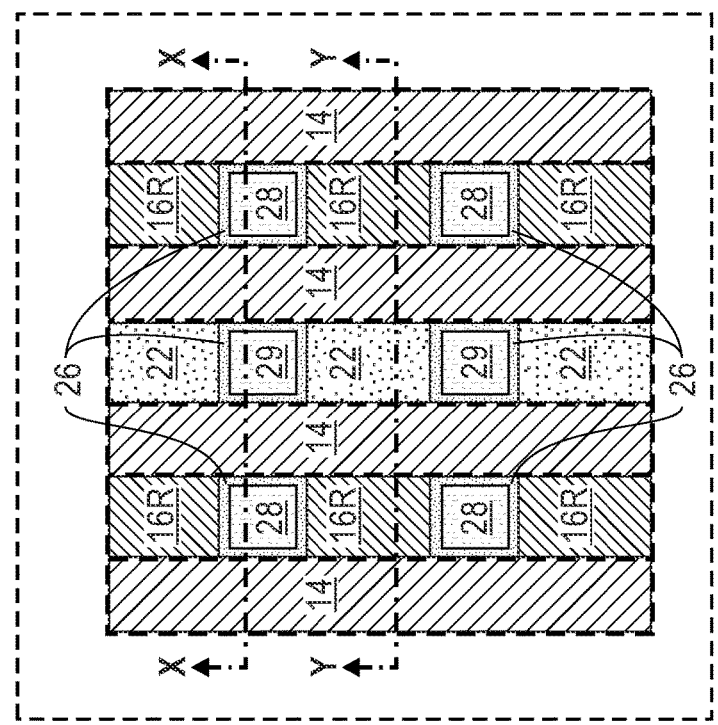
FIG. 9A is a top down view of a NVM cell having a 3D cross-point architecture in accordance with an embodiment of the present application; the drawing includes a cut X-X which is through one row of ReRAM devices, and a cut Y-Y which is between two adjacent rows of ReRAM devices.

Referring now to FIG. 9A, there is illustrated a top down view of a NVM cell having a 3D cross-point architecture in accordance with an embodiment of the present application; the drawing includes a cut X-X which is through one row of ReRAM devices (See FIG. 9B), and a cut Y-Y which is between two adjacent rows of ReRAM devices (See FIG. 9C). In the top down view shown in FIG. 9A a portion of the topmost patterned first material layer 14 is not shown so as to reveal the underlying recessed second dielectric material.

Notably, the NVM cell having the 3D cross-point architecture which is illustrated in FIGS. 8A-8B and 9A, 9B and 9C includes a plurality of vertically stacked word lines running parallel to a topmost horizontal surface of substrate 10, wherein each word line 20 of the plurality of vertically stacked word lines is vertically separated by a first dielectric material layer 14, and each word line 20 of the plurality of word lines 20 has a first sidewall that contacts a second dielectric material layer (i.e., the recessed second dielectric material layer 16R) and a second sidewall, opposite the first sidewall, that contacts an interlayer dielectric material layer 22, wherein the second dielectric material layer (i.e., the recessed second dielectric material layer 16R) has a lateral width that is less than a lateral width of the first dielectric material layer 14. At least one first bit line 28 is located in a dielectric material stack that includes a portion of each first dielectric material layer 14 and each second dielectric material layer (i.e., the recessed second dielectric material layer 16R), and at least one second bit line 29 is located in the interlayer dielectric material layer 22. In accordance with the present application, the at least one first bit line 28 and the at least one second bit line 29 run perpendicular to the plurality of vertically stacked word lines and are in direct contact with the topmost horizontal surface of the substrate 10. A dielectric switching material layer 26 is located on sidewalls of both of the at least one first bit line 28 and the at least one second bit line 29, wherein the dielectric switching material layer 26 surrounding the at least one first bit line 28 separates the at least one first bit line 28 from each word line 20 of the plurality of vertically stacked word lines, and the dielectric switching material layer 26 surrounding the at least one second bit line 29 separates the at least one second bit line 29 from each word line 20 of the plurality of vertically stacked word lines. The NVM cell illustrated in FIGS. 8A-8B and FIGS. 9A, 9B and 9C has double the density as compared to a conventional NVM cell having a 3D cross-point architecture.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A non-volatile memory (NVM) comprising:
a plurality of vertically stacked word lines running parallel to a topmost horizontal surface of a substrate, wherein each word line of the plurality of vertically stacked word lines is vertically separated by a first dielectric material layer, and each word line of the plurality of vertically stacked word lines has a first sidewall that contacts a second dielectric material layer and a second sidewall, opposite the first sidewall, that contacts an interlayer dielectric material layer, wherein the second dielectric material layer has a lateral width that is less than a lateral width of the first dielectric material layer;
at least one first bit line located in a dielectric material stack that comprises a portion of each first dielectric material layer and each second dielectric material layer;
at least one second bit line located in the interlayer dielectric material layer, wherein the at least one first bit line and the at least one second bit line run perpendicular to the plurality of vertically stacked word lines and are in direct contact with the topmost horizontal surface of the substrate; and
a dielectric switching material layer located on sidewalls of both of the at least one first bit line and the at least one second bit line, wherein the dielectric switching material layer surrounding the at least one first bit line separates the at least one first bit line from each word line of the plurality of vertically stacked word lines, and the dielectric switching material layer surrounding the at least one second bit line separates the at least one second bit line from each word line of the plurality of vertically stacked word lines.

2. The NVM of claim 1, wherein the second sidewall of each word line is vertically aligned to an outmost sidewall of each first dielectric material layer.

3. The NVM of claim 1, wherein the first dielectric material layer is composed of a dielectric material that is compositionally different from a dielectric material that provides the second dielectric material layer.

4. The NVM of claim 1, wherein a bottommost word line of the plurality of vertically stacked word lines is spaced apart from the substrate by a bottommost first dielectric material layer.

5. The NVM of claim 1, wherein each word line, the at least one first bit line and the at least one second bit line are composed of an electrically conductive material that is oxygen deficient.

6. The NVM of claim 1, wherein the dielectric switching material layer is composed of a dielectric metal oxide.

7. The NVM of claim 1, wherein the substrate comprises one or more selector devices.

8. The NVM of claim 1, wherein the at least one first bit line comprises a plurality of first bit lines, and the at least one second bit line comprises a plurality of second bit lines.

9. The NVM of claim 1, wherein the at least one first bit line and the at least one second bit line are arranged in a same row.

10. The NVM of claim 1, wherein the at least one first bit line has a topmost surface that is coplanar with a topmost surface of each of the at least one second bit line and the interlayer dielectric material layer.

* * * * *